(12) United States Patent
Lee et al.

(10) Patent No.: US 11,355,365 B2
(45) Date of Patent: Jun. 7, 2022

(54) TRANSFER APPARATUS OF AN ELECTRONIC COMPONENT

(71) Applicant: SAMSUNG ELECTRONICS CO., LTD., Suwon-si (KR)

(72) Inventors: Changjoon Lee, Suwon-si (KR); Byunghoon Lee, Suwon-si (KR); Min Park, Suwon-si (KR); Kyungwoon Jang, Suwon-si (KR); Jeonggen Yoon, Suwon-si (KR); Hyuntae Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 55 days.

(21) Appl. No.: 16/761,905

(22) PCT Filed: Dec. 3, 2018

(86) PCT No.: PCT/KR2018/015198
§ 371 (c)(1),
(2) Date: May 6, 2020

(87) PCT Pub. No.: WO2019/108045
PCT Pub. Date: Jun. 6, 2019

(65) Prior Publication Data
US 2020/0321229 A1    Oct. 8, 2020

(30) Foreign Application Priority Data

Dec. 1, 2017  (KR) .................. 10-2017-0164096
Dec. 1, 2017  (KR) .................. 10-2017-0164103
Jun. 15, 2018  (KR) .................. 10-2018-0069255

(51) Int. Cl.
*H01L 21/67* (2006.01)
*B65G 47/90* (2006.01)
*H01L 25/075* (2006.01)

(52) U.S. Cl.
CPC ........ *H01L 21/67144* (2013.01); *B65G 47/90* (2013.01); *H01L 25/0753* (2013.01)

(58) Field of Classification Search
None
See application file for complete search history.

(56) References Cited

U.S. PATENT DOCUMENTS 7,759,164 B2 *   7/2010   Maki ................. H01L 21/67132
                                                           438/113
2006/0174789 A1   8/2006   Liebau et al.
(Continued)

FOREIGN PATENT DOCUMENTS

KR   10-2006-0125620    12/2006
KR   10-2013-0077311     7/2013
(Continued)

OTHER PUBLICATIONS

International Search Report for PCT/KR2018/015198, dated Mar. 8, 2019, 5 pages.
(Continued)

*Primary Examiner* — Ronald P Jarrett
(74) *Attorney, Agent, or Firm* — Nixon & Vanderhye, P.C.

(57) ABSTRACT

Introduced is a micro-chip gripper comprising: a pin plate of which one surface is coupled to another apparatus; a hole plate of which one surface faces the other surface of the pin plate while being disposed to be spaced apart therefrom by a fixed distance, and which is driven together with the drive of the pin plate, and in which a plurality of holes making a fixed pattern are formed; pins which are inserted into the holes of the hole plate and of which one end part is supported by the pin plate; and an adhesion layer which covers the other surface of the hole plate. Other embodiments are possible.

13 Claims, 18 Drawing Sheets

(56) References Cited

U.S. PATENT DOCUMENTS

| | | | |
|---|---|---|---|
| 2010/0123268 A1 | 5/2010 | Menard | |
| 2013/0167369 A1 | 7/2013 | Oh et al. | |
| 2014/0037413 A1* | 2/2014 | Takashima | B25J 15/0616 |
| | | | 414/680 |
| 2014/0130691 A1 | 5/2014 | Yang et al. | |
| 2014/0291119 A1 | 10/2014 | Courts et al. | |
| 2015/0111329 A1 | 4/2015 | Wu et al. | |
| 2015/0231909 A1 | 8/2015 | Palone | |
| 2017/0133250 A1* | 5/2017 | Menard | B41F 16/006 |
| 2017/0243772 A1 | 8/2017 | Oh | |
| 2018/0204973 A1 | 7/2018 | Jeung et al. | |
| 2019/0259728 A1 | 8/2019 | Hwangbo et al. | |

FOREIGN PATENT DOCUMENTS

| | | |
|---|---|---|
| KR | 10-2013-0079031 | 7/2013 |
| KR | 10-2014-0042320 | 4/2014 |
| KR | 10-2014-0053883 | 5/2014 |
| KR | 10-1714737 | 3/2017 |
| KR | 10-1754528 | 7/2017 |
| KR | 10-2017-0099028 | 8/2017 |
| KR | 10-1800367 | 11/2017 |

OTHER PUBLICATIONS

Written Opinion of the ISA for PCT/KR2018/015198, dated Mar. 8, 2019, 6 pages.

\* cited by examiner

TRANSFER APPARATUS OF AN ELECTRONIC COMPONENT

This application is the U.S. national phase of International Application No. PCT/KR2018/015198, filed Dec. 3, 2018 which designated the U.S. and claims priority to KR Patent Application No. 10-2017-0164096 filed 1 Dec. 2017, KR Patent Application No. 10-2017-0164103 filed Dec. 1, 2017, and KR Patent Application No. 10-2018-0069255 filed Jun. 15, 2018, the entire contents of each of which are hereby incorporated by reference.

FIELD

Various embodiments of the disclosure relate to an apparatus for transferring an electronic component.

DESCRIPTION OF RELATED ART

In a conventional display device, a light emitting diode (LED) is usually mounted to the rear surface or the lateral edge of an LCD panel, which cannot emit light by itself to the outside, to function as a backlight. The LCD panel has a limitation in improving light efficiency in that the LCD panel cannot emit light by itself and indirectly uses light from the outside so as to output light. Accordingly, a panel using an OLED which is a light emitting element, is drawing attention. However, disadvantages of the OLED panel, such as difficulty of enlargement, a low mass-production yield rate, and degradation of a luminance characteristic after use of the OLED panel for a long time, are required to be improved. Therefore, a display device employing a new scheme, which is different from the existing display devices, is required.

SUMMARY

As a display device employing a new scheme to replace an LCD panel and an OLED panel, a device employing a scheme, in which an LED package is directly mounted on a panel to implement a display, is emerging.

The LED package having a size of tens to hundreds μm is required to be directly mounted on each pixel of a panel. For example, in order to implement a display supporting UHD resolution (3840×2160), a total of 24,883,200 LED packages should be mounted in a single panel. However, in order to implement a display device employing a scheme in which an LED package is mounted on a panel, a technology of rapidly transferring and mounting multiple LED package chips onto a panel substrate can be required.

Various embodiments of the disclosure provide a transfer apparatus capable of transferring a large number of microelectronic components, such as LED packages, simultaneously.

A micro-chip gripper according to various embodiments may include: a pin plate having one surface coupled to another apparatus; a hole plate having one surface facing the other surface of the pin plate while being spaced a predetermined distance apart therefrom, the hole plate being driven along with the drive of the pin plate and including a plurality of holes formed therethrough according to a predetermined pattern; a pin inserted into each of the holes of the hole plate and having one end portion supported by the pin plate; and an adhesive layer covering the other surface of the hole plate.

A micro-chip transfer apparatus according to various embodiments may include: a body; a robot arm connected to the body and rotating or linearly moving; a pin plate having one surface coupled to an end of the robot arm; a hole plate having one surface facing the other surface of the pin plate while being spaced a predetermined distance apart therefrom, the hole plate being driven along with the drive of the pin plate and including a plurality of holes formed therethrough according to a predetermined pattern; a pin inserted into each of the holes of the hole plate and having one end portion supported by the pin plate; and an adhesive layer covering the other surface of the hole plate.

A micro-chip gripper according to various embodiments may include: a pin plate having one surface coupled to another apparatus; a hole plate having one surface facing the other surface of the pin plate while being spaced a predetermined distance apart therefrom, the hole plate being driven along with the drive of the pin plate and including a plurality of holes formed therethrough according to a predetermined pattern; a pin inserted into each of the holes of the hole plate and having one end portion supported by the pin plate; and an adhesive layer covering the other surface of the hole plate.

A micro-chip transfer apparatus according to various embodiments may include: a body; a robot arm connected to the body and rotating or linearly moving; a pin plate having one surface coupled to an end of the robot arm; a hole plate having one surface facing the other surface of the pin plate while being spaced a predetermined distance apart therefrom, the hole plate being driven along with the drive of the pin plate and including a plurality of holes formed therethrough according to a predetermined pattern; a pin inserted into each of the holes of the hole plate and having one end portion supported by the pin plate; and an adhesive layer covering the other surface of the hole plate.

A transfer apparatus of an electronic component according to various embodiments may include: a plurality of pins; a first plate connected to the plurality of pins to support the plurality of pins; a second plate including a first surface opposite to one surface of the first plate, and a second surface oriented in a direction opposite to the first surface, and including a plurality of hole regions through which the plurality of pins may be inserted according to the drive of the first plate; and a third plate having one surface attached to the second surface of the second plate and including a plurality of hole regions through which the plurality of pins may be inserted according to the drive of the first plate, wherein the third plate may include a polydimethylsiloxane (PDMS) layer.

According to various embodiments of the disclosure, a large number of electronic components can be rapidly and accurately transferred to a substrate. In particular, the embodiments may provide a transfer apparatus capable of transferring a large number of microelectronic components, such as micro LED packages, simultaneously.

According to various embodiments of the disclosure, although an electronic component (for example, a microchip), namely an object to be held, is not disposed on a flat surface, or although a transfer apparatus (for example, a micro-chip gripper) slantingly approaches an electronic component, a transfer apparatus can transfer an electronic component to a desired position without failing to pick up the electronic component.

DETAILED DESCRIPTION OF EXAMPLE EMBODIMENTS

Figure 1:
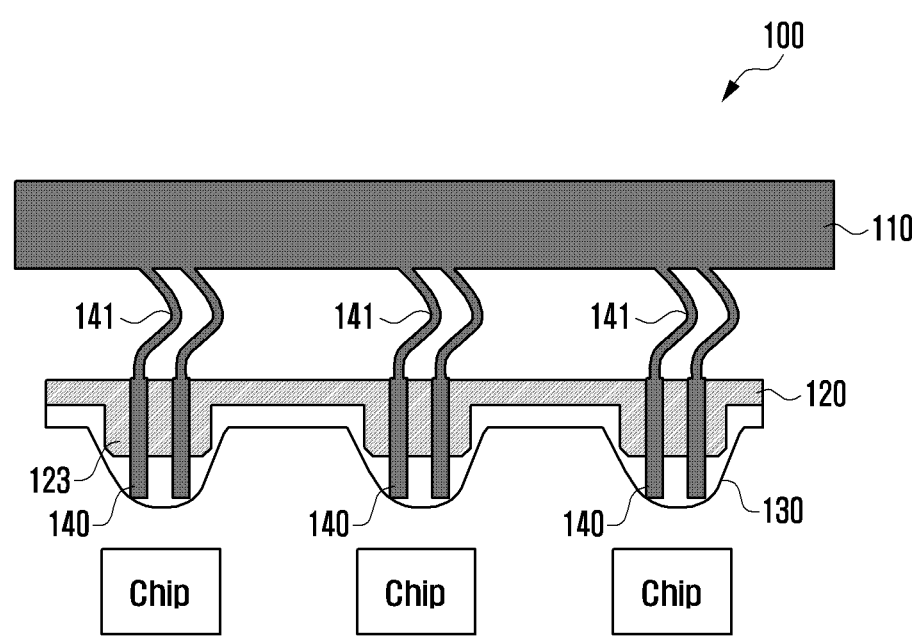
FIG. 1 is a conceptual diagram illustrating a transfer apparatus according to various embodiments of the disclosure.

Hereinafter, various embodiments will be described with reference to the accompanying drawings. It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements.

As used herein, the expression "have", "may have", "include", or "may include" refers to the existence of a corresponding feature (e.g., numeral, function, operation, or constituent element such as component), and does not exclude one or more additional features.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases.

As used herein, such terms as "1st" and "2nd," or "first" and "second" may be used to simply distinguish a corresponding component from another, and does not limit the components in other aspect (e.g., importance or order).

It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly or via the other element(e.g., a third element).

The expression "configured (or set) to", used in this specification, may be interchangeably used with, for example, "suitable for," "having the capacity to," "designed to," "adapted to," "made to," or "capable of" according to circumstances. The term "configured (or set) to" may not necessarily mean "specifically designed to" in hardware. Instead, in some cases, the expression "device configured to" may mean that the device "can ~" together with other devices or components. For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. A singular expression may include a plural expression unless they are definitely different in a context. Unless defined otherwise, all terms used herein, including technical terms and scientific terms, may have the same meaning as commonly understood by a person of ordinary skill in the art to which the disclosure pertains. Terms, such as those defined in commonly used dictionaries, should be interpreted as having a meaning that is the same or similar to their meaning in the context of the relevant art and will not be interpreted in an idealized or overly formal sense unless expressly so defined herein. In some cases, even the term defined in the disclosure should not be interpreted to exclude embodiments of the disclosure.

An electronic device according to various embodiments of the disclosure may be a device with a communication function. For example, the electronic device may include at least one of a smart phone, a tablet personal computer (PCs), a mobile phone, a video phone, an e-book reader, a desktop PC, a laptop PC, a netbook computer, a personal digital assistant (PDA), a portable multimedia player (PMP), a MP3 player, a mobile medical device, a camera, a wearable device (e.g., head-mounted-device (HMD) such as electronic glasses, electronic clothes, an electronic bracelet, an electronic necklace, an electronic appcessory, an electronic tattoo, or a smart watch).

According to some embodiments, the electronic device may be a smart home appliance with a communication function. The smart home appliances may include at least one of, for example, televisions, digital video disk (DVD) players, audio players, refrigerators, air conditioners, cleaners, ovens, microwaves, washing machines, air purifiers, set-top boxes, TV boxes (e.g., HomeSync™ of Samsung, Apple TV™, or Google TV™), game consoles, electronic dictionaries, electronic keys, camcorders, or electronic frames.

According to some embodiments, the electronic device may include at least one of various medical devices such as a magnetic resonance angiography (MRA) scanner, a magnetic resonance imaging (MRI) scanner, a computed tomography (CT) scanner, a scanner, an ultrasonograph, or the like, a navigation device, a Global Positioning System (GPS) receiver, an Event Data Recoder (EDR), a Flight Data Recoder (FDR), a vehicle infotainment device, an electronic equipment for ship (for example a ship navigation device and gyro-compass and the like, avionics, a security device, a head unit for vehicle, an industrial or household robot, ATM (automatic teller machine) in banking facilities or POS (point of sales) in stores.

According to some embodiments, the electronic device may include at least one of a part of furniture or a building/structure having a communication function, an electronic board, an electronic signature receiving device, a projector, and various kinds of measuring instruments (e.g., a water meter, an electric meter, a gas meter, a radio wave meter, and the like). An electronic device according to various embodiments of the disclosure may be a combination of one or more of above described various devices. Also, an electronic device according to various embodiments of the disclosure may be a flexible device. Also, an electronic device according to various embodiments of the disclosure is not limited to the above described devices.

FIG. 1 is a conceptual diagram illustrating a micro-chip gripper 100 according to an embodiment of the disclosure.

A micro-chip gripper 100 according to various embodiments may indicate a transfer apparatus for transferring a microelectronic component.

The micro-chip gripper 100 according to various embodiments may include a pin plate 110, a hole plate 120, pins 140, and an adhesive layer 130.

The pin plate 110 may be a basic frame of the micro-chip gripper 100, and has one surface coupled to another apparatus so as to be linked thereto.

For example, the pin plate 110 may be connected to a power source for operating the micro-chip gripper 100, and may be coupled to a robot arm (not shown) connected to a body (not shown) of the micro-chip transfer apparatus. The other surface of the pin plate 110 may be in contact with the pins 140 to support the pins 140.

One surface of the hole plate 120 may be disposed to face the other surface of the pin plate 110 and to be spaced a predetermined distance apart from the pin plate 110. For example, the hole plate 120 may be disposed parallel to the pin plate 110 while being spaced a predetermined distance apart therefrom, and may be disposed, such that the predetermined distance is maintained. For example, the hole plate 120 may include micro holes formed therethrough, the holes through which the pins 140 may be inserted. The hole plate 120 may include a plurality of holes, and each of the holes of the hole plate 120 may be formed at a position corresponding to an arrangement position and/or a size of an electronic component (for example, a microchip) that the micro-chip gripper 100 is to hold.

For example, in case electronic components to be held form a quadrangular pattern, each of the holes of the hole plate 120 may be formed to correspond to a position where each of the electronic components is disposed, while forming a quadrangular pattern, and in case electronic components form a circular pattern, each of the holes of the hole plate 120 may be formed to correspond to a position where each of the electronic components is disposed, while forming a circular pattern. For example, the transfer apparatus 100 may hold at least some of electronic components of a wafer including electronic components to be transferred in response to the positions and the number of the holes. The hole plate 120 may include at least one protrusion 123 at a position corresponding to positions of the plurality of holes. The protrusion 123 may be formed in a form in which at least a part of the other surface of the hole plate 120 protrudes.

According to various embodiments, the positions of the protrusion 123 and the hole may overlap each other, and a hole may be formed through the protrusion 123.

At least one or more holes may be formed corresponding to the number of protrusions 123. For example, a plurality of holes may be formed through one protrusion 123.

In a process of holding an electronic component by means of the adhesive force of the adhesive layer 130, the protrusion 123 may play a role of pressing the adhesive layer 130 to enable the electronic component and the adhesive layer 130 to be bonded to each other. The pins 140 may include an elastic material. For example, the pins 140 may include platinum, silver, nickel, copper, gold, or an alloy thereof. The pins 140 may be arranged to be inserted into the positions of the holes formed through the hole plate 120, and may move through the insides of the holes. For example, when a plurality of holes are formed through the protrusion 123, a single pin 140 may be disposed at each of the holes, and a plurality of pins 140 may be disposed at a single protrusion 123 to slide through the protrusion 123 and the holes thereof.

At least a part of the pin 140 may be formed to be longer than a distance from the other surface of the pin plate 110 to the other surface of the hole plate 120. For example, when one end portion of the pin 140 contacts the pin plate 110, the other end portion of the pin may be inserted through the hole of the hole plate 120 to protrude. For example, the other end portion of the protruding pin 140 may push the adhesive layer 130 to decrease an area in which an electronic component and the protrusion 123 of the hole plate 120 adhere to each other, and may play a role of reducing the adhesive force of the adhesive layer 130, which is applied to the electronic component.

At least a part of the pin 140 may be a curved portion 141 which is formed corresponding to a predetermined space between the pin plate 110 and the hole plate 120. For example, the elastic force of the curved portion 141 may prevent the pin 140 from sliding until the pin is completely separated from the hole plate 120. For example, in a process in which the adhesive layer 130 holds an electronic component, the curved portion 141 of the pin 140 may provide the elastic force by which the other end portion of the pin 140 pushes the adhesive layer 130, and may also guide a curved deformation direction of the pin 140 so as to enable the pin to slide through the hole along a direction perpendicular to the hole plate 120. The adhesive layer 130 may be formed to cover at least a part of the other surface of the hole plate 120. For example, the adhesive layer 130 may be formed to cover the entire area of the hole plate 120, and may be formed to cover a section where the hole of the hole plate 120 is formed. The adhesive layer 130 is a section directly contacting an electronic component to be held, and may hold the electronic component by means of the adhesive force of the adhesive layer 130.

The adhesive layer 130 may include at least one adhesive tape among acryl-based, epoxy-based, UV curable, and thermosetting tapes, and may include adhesive silicone.

FIGS. 2A to 2D are diagrams sequentially illustrating a method in which a transfer apparatus 100 (for example, a micro-chip gripper) according to an embodiment of the disclosure holds an electronic component.

For example, an electronic component according to an embodiment of the disclosure, which is to be an object to be held, may be a micro LED chip which is mounted on a display panel. The mounted micro LED chip is disposed to correspond to each pixel of the display panel and is directly related to resolution of the display panel, and the microchip is required to be elaborately disposed without being missed or disturbed.

Figure 2A:
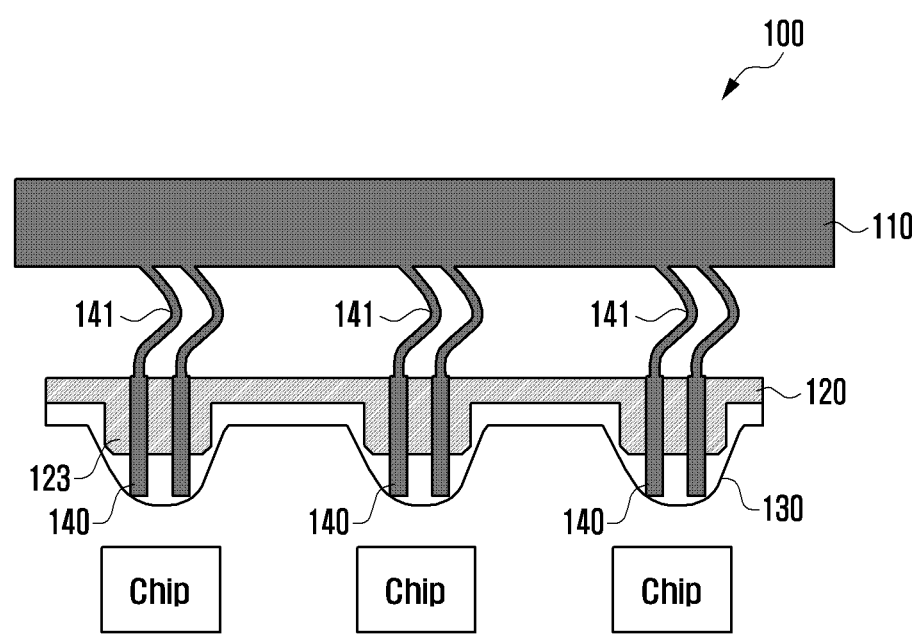
FIGS. 2A, 2B, 2C, and 2D are diagrams sequentially illustrating a method in which a transfer apparatus according to various embodiments of the disclosure holds an electronic component.

Referring to FIG. 2A, a protrusion 123 and/or a hole of a hole plate 120 may be formed corresponding to a position of an electronic component to be held.

Figure 2B:
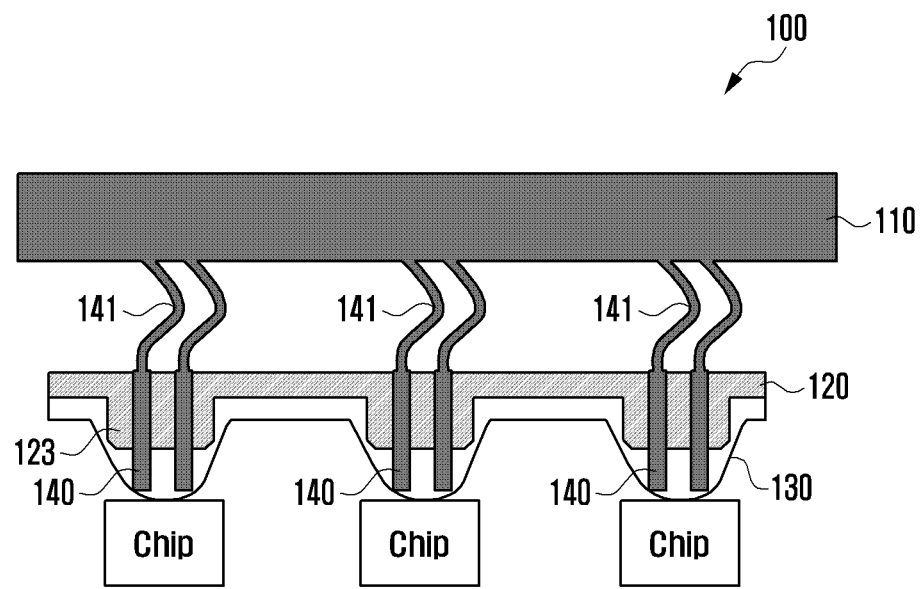

As shown in FIG. 2B, a transfer apparatus 100 according to an embodiment of the disclosure may approach toward an electronic component to be held, and an adhesive layer 130 may thus contact the electronic component.

For example, as illustrated in FIG. 2B, some of electronic components may be held by the contact of the adhesive layer 130, but at least other electronic components may not be held due to a difference of the adhesive force among regions of the adhesive layer 130 or the degree of flatness of a plane on which the electronic components are disposed. In addition, in a process in which the hole plate 120 approaches the electronic components, at least some of the electronic components may not be held even in case the hole plate fails to approach completely parallel to a plane on which the electronic components are disposed.

Figure 2C:
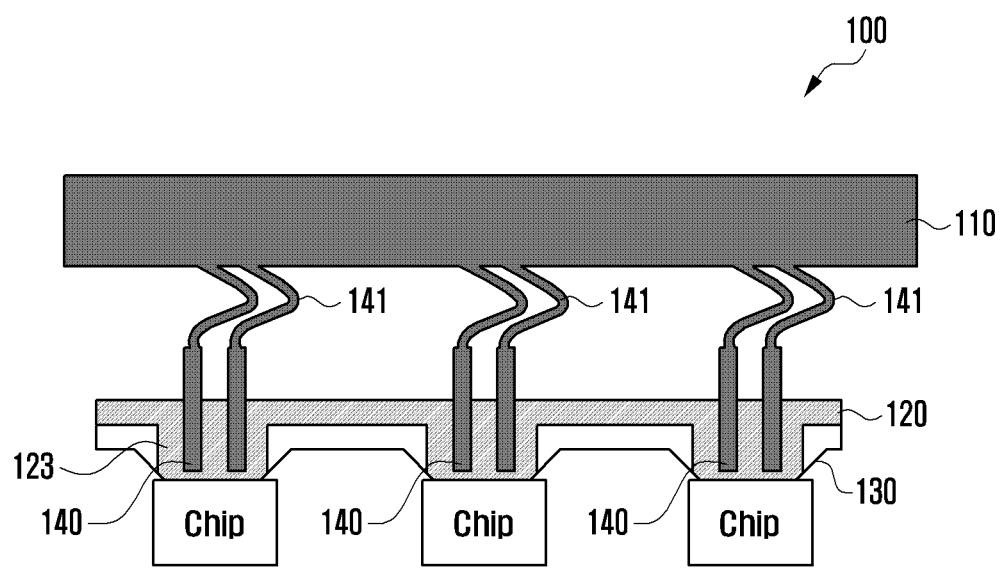

According to various embodiments of the disclosure, as illustrated in FIG. 2C, the protrusion 123 of the hole plate 120 may press the adhesive layer 130 and the electronic components to enable each of the electronic components to adhere to the adhesive layer 130. A curved portion 141 of a pin 140 having protruding in this process may be at least partially deformed, and may be pushed into the hole plate 120.

Figure 2D:
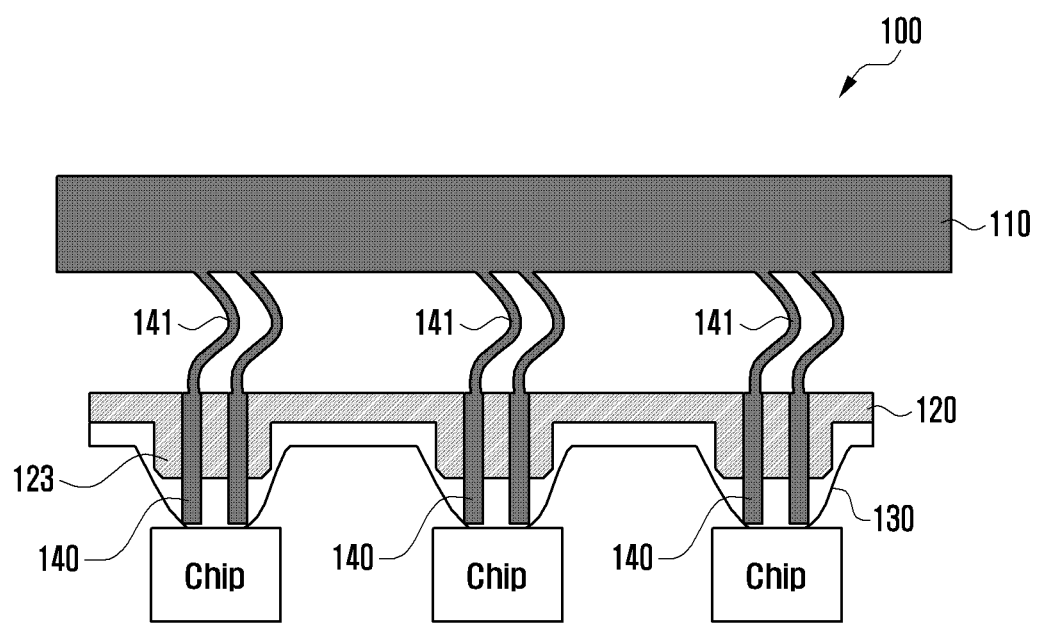

Referring to FIG. 2D, in a process of raising the held electronic components, the pin 140 protrudes again to push the electronic components, and may thus decrease an adhesion area between the adhesive layer 130 and each of the electronic components.

For example, as shown in FIG. 2C, when the adhesion area between the adhesive layer 130 and the electronic component is maintained, the electronic component may not be separated from the adhesive layer 130 in a process of separating the electronic component from the transfer apparatus 100. For example, the pin 140 pushes the electronic component to decrease the adhesion area between the adhesive layer 130 and the electronic component and thus reduce the adhesive force between the adhesive layer 130 and the electronic component, and may thus effectively separate the electronic component from the transfer apparatus 100.

Figure 3A:
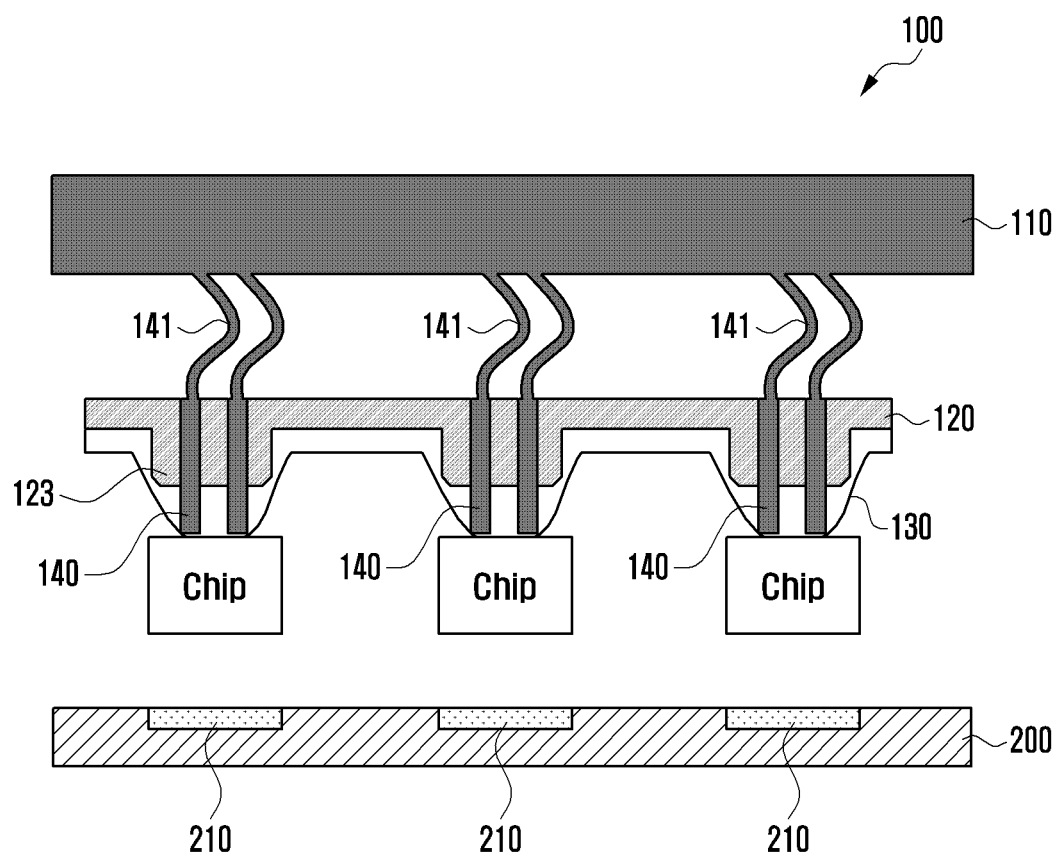
FIGS. 3A, 3B, and 3C are diagrams sequentially illustrating a method in which a transfer apparatus according to various embodiments of the disclosure transfers an electronic component.
Figure 3B:
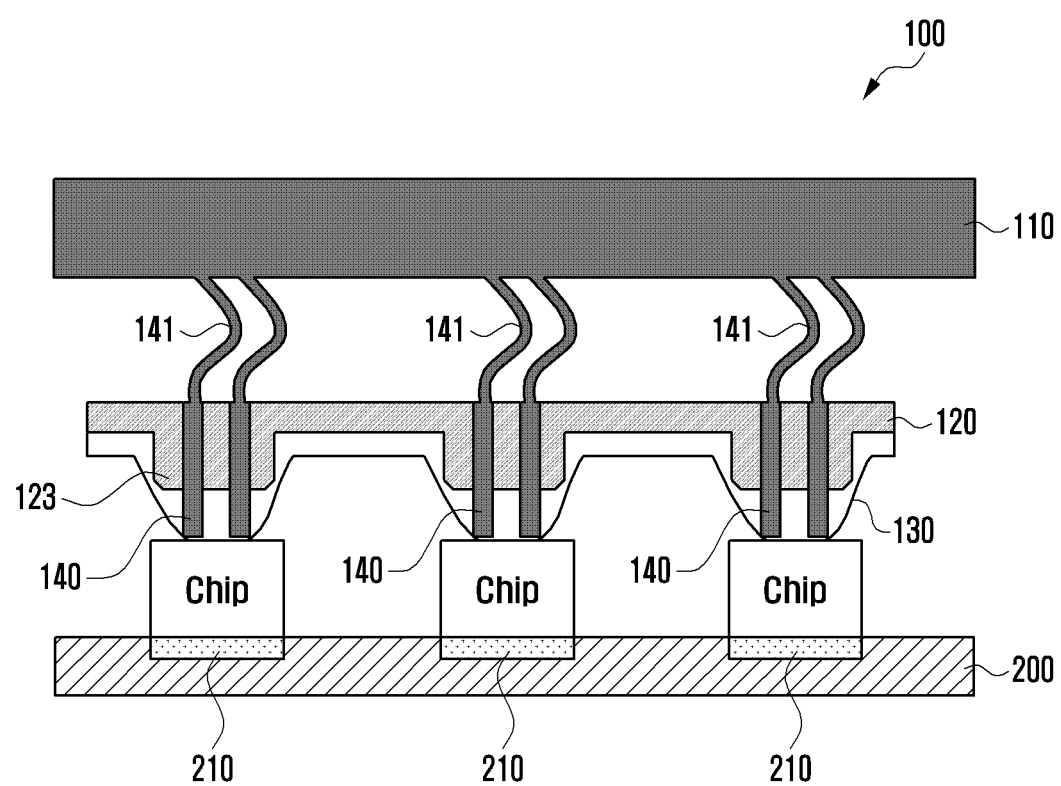
Figure 3C:
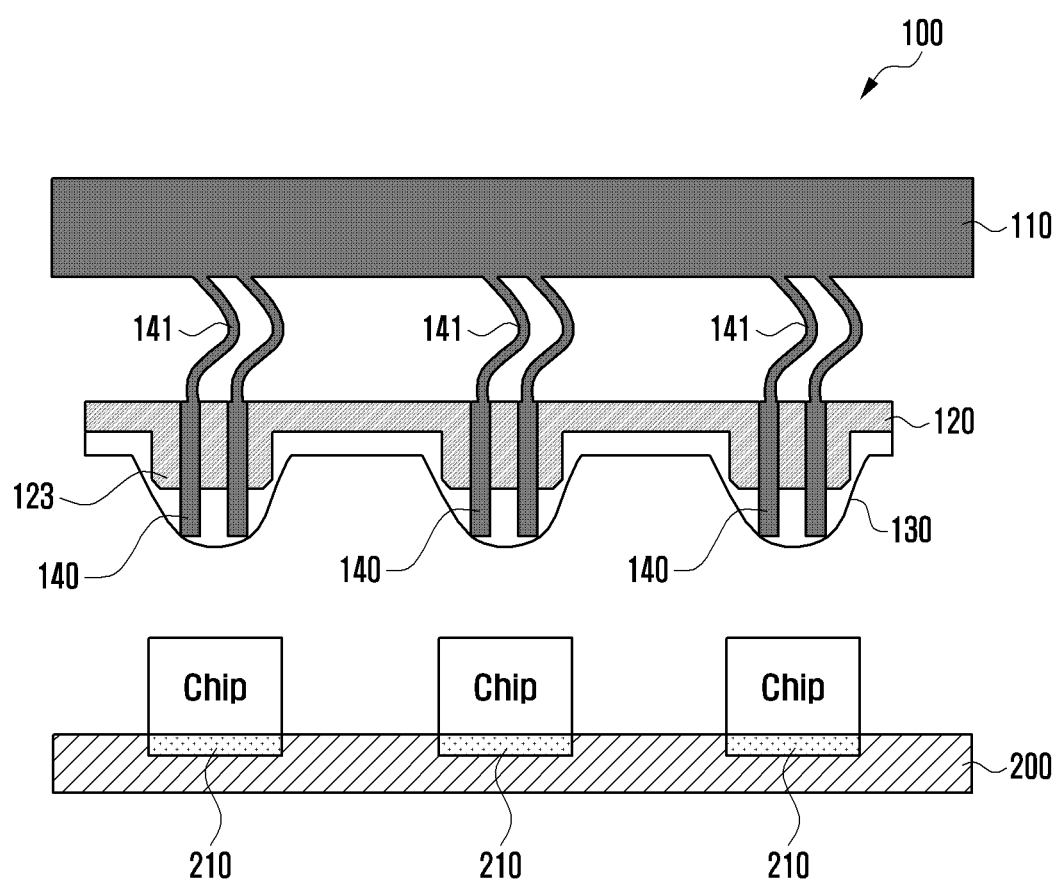

FIGS. 3A to 3C are diagrams sequentially illustrating a method in which the transfer apparatus 100 according to an embodiment of the disclosure mounts at least one electronic component on a circuit board.

An electronic component, which is to be an object to be held by the transfer apparatus 100 according to various embodiments, may be a micro LED chip which is mounted on a display panel, and the held micro LED chip may be mounted on a circuit board 200.

On the circuit board 200, a lead 210 for soldering and a metal paste such as silver (Ag) and copper (Cu) may be disposed at a position where a micro LED chip is to be mounted, and a conductive or nonconductive tape may be disposed at the position. As an example, the lead 210 itself may be viscous in a molten liquid state, or may be applied in a state in which the powdered lead 210 is mixed with a flux to be viscous.

The viscosity of the lead 210 disposed on the circuit board 200 may be weaker than the adhesive force between the adhesive layer 130 and the micro LED chip in the state of FIG. 2C, and may be stronger than the adhesive force between the adhesive layer 130 and the micro LED chip in the state of FIG. 2D.

Referring to FIG. 3A, the transfer apparatus 100 according to an embodiment of the disclosure may align and position the held electronic component (for example, the micro LED chip) at a position of the lead 210 of the circuit board 200.

As illustrated in FIG. 3B, the transfer apparatus 100 according to an embodiment of the disclosure may approach toward the circuit board 200 to enable the electronic component to contact the lead 210 of the circuit board 200, and may also approach to enable the protrusion 123 of the hole plate 120 not to directly press the electronic component.

The adhesive force between the electronic component and the adhesive layer 130 may be similar to the adhesive force of FIG. 2D, and the pin 140 of the transfer apparatus 100 pushes the electronic component to decrease an adhesion area between the adhesive layer 130 and the electronic component and thus weaken the adhesive force therebetween. For example, in case the electronic component and the lead 210 are in contact with each other, the viscosity of the lead 210 disposed on the circuit board 200 may be stronger than the adhesive force between the electronic component and the adhesive layer 130 illustrated in FIG. 3B. For example, the electronic component may be separated from the adhesive layer 130 to be mounted on the circuit board 200.

The transfer apparatus 100 according to various embodiments may hold all of the plurality of electronic components having been arranged according to the predetermined pattern through the processes of FIGS. 2A to 3C, and may mount the same on the circuit board 200 without disturbing or failing to pick up some of the electronic components.

An electronic components (for example, a micro-chip gripper) according to an embodiment of the disclosure may include: a pin plate having one surface coupled to another apparatus; a hole plate having one surface facing the other surface of the pin plate while being spaced a predetermined distance apart therefrom, the hole plate being driven along with the drive of the pin plate and including a plurality of holes formed therethrough according to a predetermined pattern; a pin inserted into each of the holes of the hole plate and having one end portion supported by the pin plate; and an adhesive layer covering the other surface of the hole plate.

A hole of the hole plate may be formed corresponding to an arrangement pattern of a microchip to be held.

A protrusion may be formed on the other surface of the hole plate, corresponding to an arrangement pattern of a microchip to be held.

A hole of the hole plate may be formed corresponding to a position of the protrusion.

A hole of the hole plate is formed corresponding to a position of the protrusion, and at least one or more holes may be formed corresponding to a single protrusion.

A length of the pin may be formed to be longer than a distance from the other surface of the pin plate to the other surface of the hole plate.

The pin may include a curved portion formed at a position corresponding to a space between the pin plate and the hole plate.

A micro-chip transfer apparatus according to an embodiment of the disclosure may include: a body; a robot arm connected to the body and rotating or linearly moving; a pin plate having one surface coupled to an end of the robot arm; a hole plate having one surface facing the other surface of the pin plate while being spaced a predetermined distance apart therefrom, the hole plate being driven along with the drive of the pin plate and including a plurality of holes formed therethrough according to a predetermined pattern; a pin inserted into each of the holes of the hole plate and having one end portion supported by the pin plate; and an adhesive layer covering the other surface of the hole plate.

A hole of the hole plate may be formed corresponding to an arrangement pattern of a microchip to be held.

A protrusion may be formed on the other surface of the hole plate, corresponding to an arrangement pattern of a microchip to be held.

A hole of the hole plate may be formed corresponding to a position of the protrusion.

A hole of the hole plate is formed corresponding to a position of the protrusion, and at least one or more holes may be formed corresponding to a single protrusion.

A length of the pin may be formed to be longer than a distance from the other surface of the pin plate to the other surface of the hole plate.

The pin may include a curved portion formed at a position corresponding to a space between the pin plate and the hole plate.

Figure 4A:
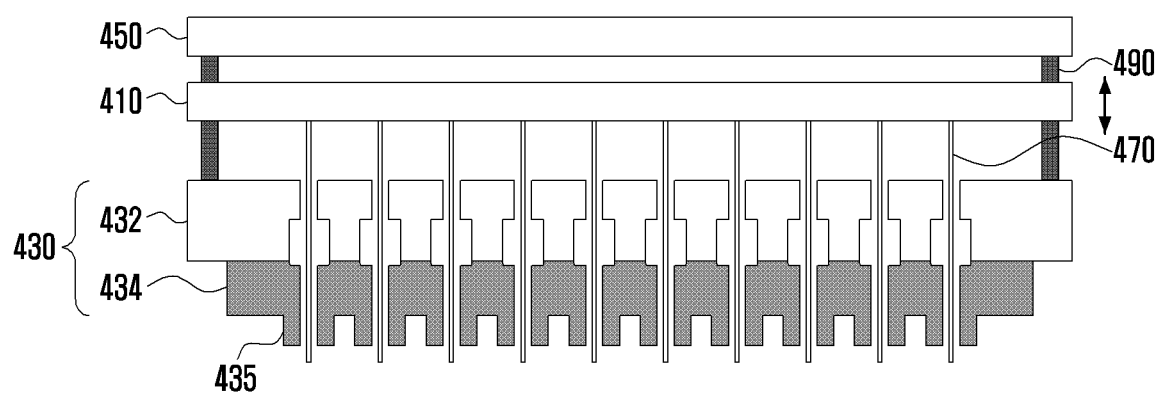
FIG. 4A is a cross-sectional view of a transfer apparatus of an electronic component according to various embodiments of the disclosure.

FIG. 4A is a cross-sectional view of a transfer apparatus of an electronic component according to various embodiments of the disclosure.

Referring to FIG. 4A, a transfer apparatus of an electronic component according to various embodiments may include a first plate 410, a hole plate 430 (for example, a second plate 432 and a third plate 434), and a plurality of pins 470.

According to various embodiments, the first plate 410 may be connected to the plurality of pins 470 to support the pins 470.

According to various embodiments, the first plate 410 may be operated to at least partially move up and down. As the first plate 410 moves up and down, the plurality of pins 470 connected to the first plate 410 may move up and down along with the first plate 410.

According to various embodiments, the hole plate 430 may include the first plate 432 and the second plate 434.

According to various embodiments, the second plate 432 may be positioned opposite to one surface of the first plate 410. In addition, the second plate 432 may be attached to the third plate 434 made of a material different from that of the second plate 432.

For example, the second plate 432 may include a first surface and a second surface. The first surface may be positioned opposite to the one surface of the first plate 410 while being spaced a predetermined distance apart therefrom, and the second surface oriented in a direction opposite to the one surface of the first plate 410 may be attached to the third plate 434.

The second plate 432 and the third plate 434 may be made of different materials.

For example, the second plate 432 may be made of a material having an excellent flatness characteristic. The second plate 432 may be made of one of metal, ceramic, or glass.

For example, the third plate 434 may be made of a material having an adhesion characteristic which is better than that of the second plate 432. The third plate 434 may include polydimethylsiloxane (PDMS).

According to various embodiments, each of the second plate 432 and the third plate 434 may include a plurality of hole regions. For example, the plurality of hole regions may be regions through which the plurality of pins 470 according to various embodiments of the disclosure may be inserted.

For example, the plurality of hole regions included in each of the second plate 432 and the third plate 434 may be regions through which the plurality of pins 470, which move along with the first plate 410 according to the drive of the first plate 410, may be inserted.

For example, as the plurality of pins 470 move up and down, one end of each of the pins 470 may be inserted through an end of the third plate 434 to protrude to the outside of the third plate 434 or not.

According to various embodiments, the hole plate 430 may include the second plate 432 having an excellent flatness characteristic and a high strength characteristic, and the third plate 434 having an excellent adhesion characteristic, so as to transfer an electronic component to an accurate position and thus include a hole region formed therethrough, the hole region having a size satisfying a required specification. For example, a hole region of the hole plate 430 is required to satisfy a size condition in which a pin may be inserted through, but an electronic component may not pass through the hole region.

According to various embodiments, an electronic component may include an LED package. For example, the electronic component may include a micro component having a major diameter of 1 mm or lower.

According to various embodiments, a transfer apparatus of an electronic component may further include a support shaft 490 for supporting the first plate 410 and the second plate 432 when the first plate 410 is operated.

For example, the support shaft 490 may support each of the plates, such that, when the first plate 410 is operated to move up and down, the first plate 410, the second plate 432, and the third plate 434 adhering to the second plate 432 are not disturbed to the left or right, and the plurality of pins 470 are positioned on the same axis as that of the plurality of hole regions of the second plate 432 and the third plate 434.

According to various embodiments, a transfer apparatus of an electronic component may further include a fourth plate 450. For example, the fourth plate 450 may function as a cover which prevents the first plate 410 from separating from the support shaft 490 when the first plate 410 is operated.

Figure 4B:
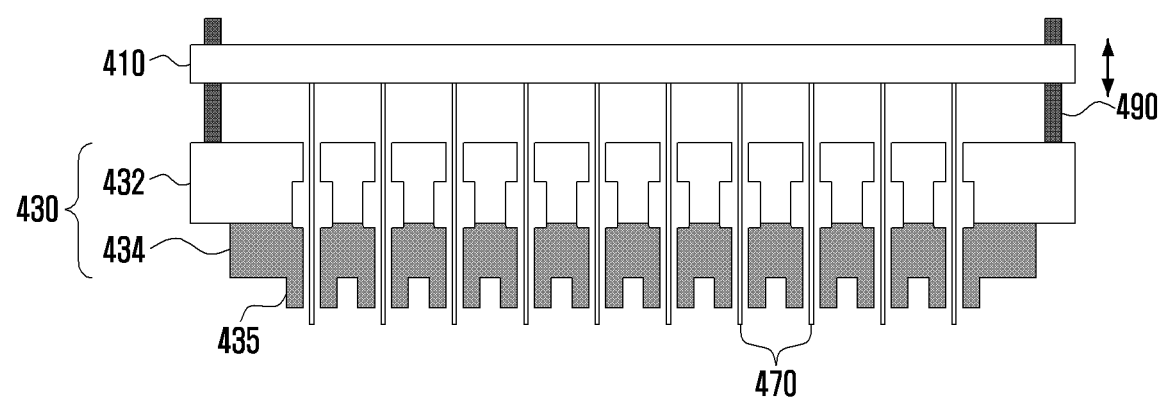
FIG. 4B is a cross-sectional view of a transfer apparatus of an electronic component according to various embodiments of the disclosure.

FIG. 4B is a view illustrating a transfer apparatus of an electronic component according to another embodiment of the disclosure. As illustrated in FIG. 4B, a transfer apparatus according to various embodiments may not include the fourth plate 450 unlike the transfer apparatus of FIG. 4A.

FIGS. 5A to 5F are diagrams illustrating a method of transferring by a transfer apparatus of an electronic component according to various embodiments of the disclosure.

A transfer apparatus of an electronic component according to various embodiments may raise an electronic component (for example, an LED package chip) disposed at a specific position and then move the same to another position.

Figure 5A:
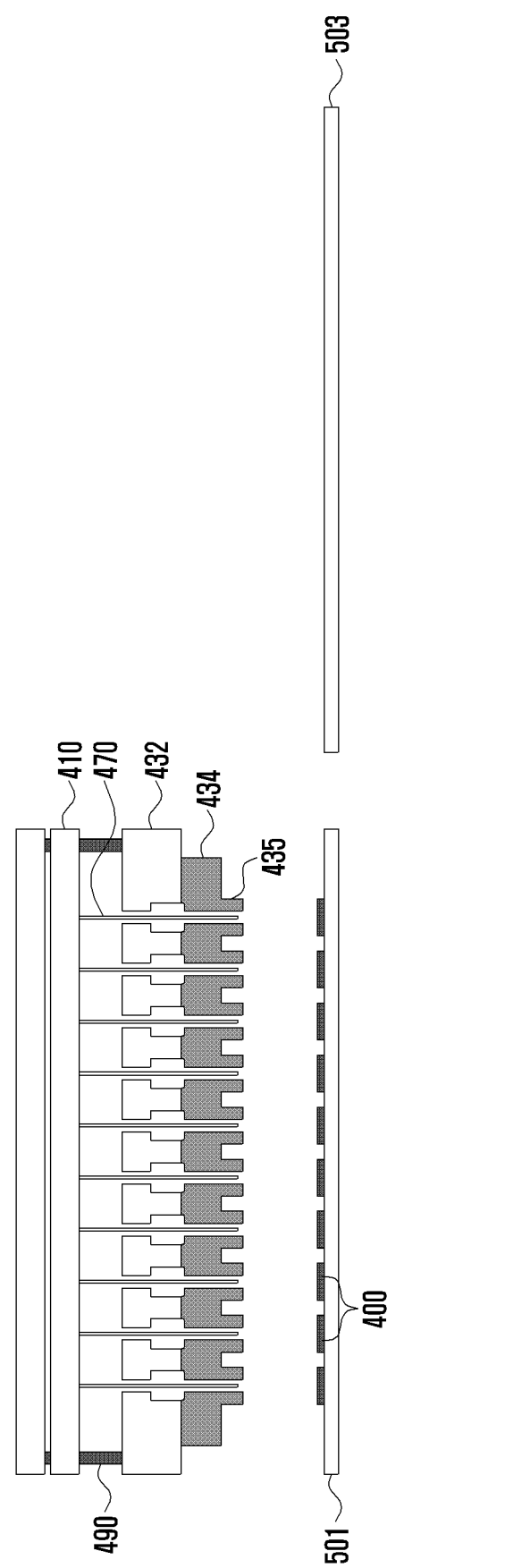
FIGS. 5A, 5B, 5C, 5D, 5E, and 5F are diagrams illustrating a method of transferring by a transfer apparatus of an electronic component according to various embodiments of the disclosure.

For example, in FIG. 5A, in order to raise a plurality of electronic components 400 arranged on a substrate 501, a position of a transfer apparatus may be adjusted to correspond to a position on the substrate 501, where the electronic components 400 are arranged.

Figure 5B:
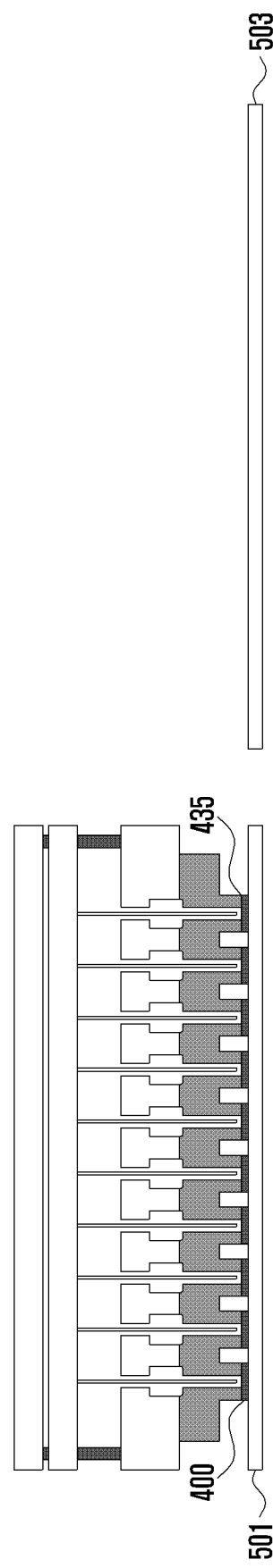

In FIG. 5B, the transfer apparatus may approach the substrate 501 to enable the electronic components 400 of the substrate 501 to adhere to a protrusion 435 of a third plate 434.

Figure 5C:
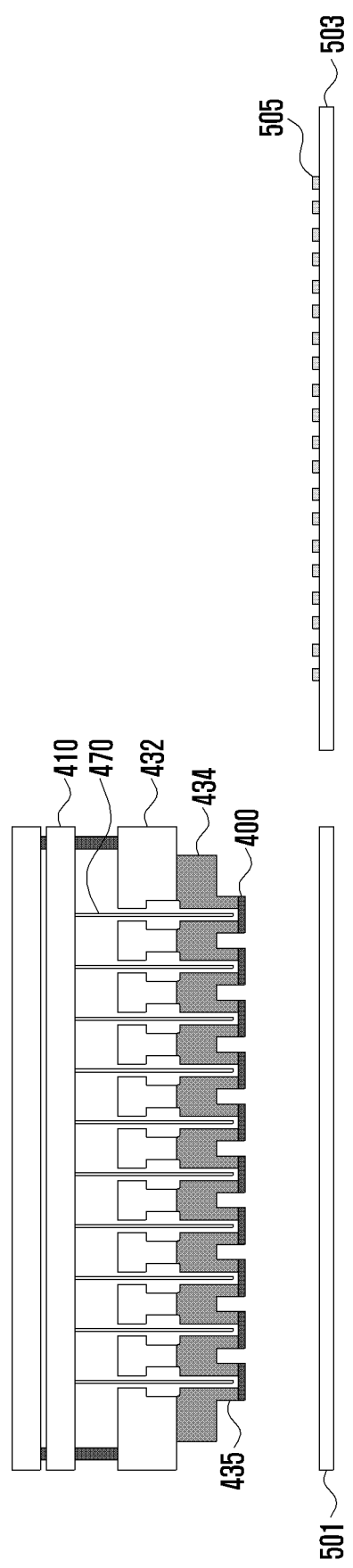
Figure 5D:
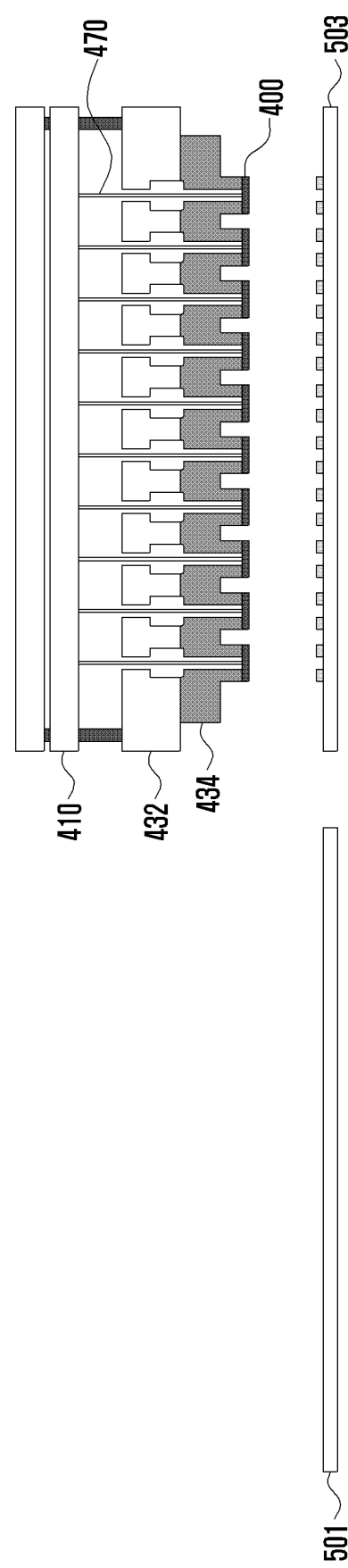

As illustrated in FIG. 5C, when the protrusion 435 of the third plate 434 and the electronic components 400 contact each other and the electronic components 400 adhere to the protrusion 435, the transfer apparatus may be raised above the substrate 501, and as illustrated in FIG. 5D, when the transfer apparatus holding the electronic components 400 is raised, the transfer apparatus may move to another position onto which the electronic components 400 are to be transferred, such as a predetermined position on a substrate 503.

According to various embodiments, as illustrated in FIGS. 5C and 5D, when the electronic components 400 are transferred onto the substrate 503, a solder paste 505 may be previously applied onto a predetermined position on the substrate 503 to enable the electronic components 400 to adhere to the substrate 503.

In FIGS. 5A to 5D, only a first plate 410 of the transfer apparatus is not operated to descend and the first plate 410, a second plate 432, and the third plate 434 of the transfer apparatus move together, and a plurality of pins 470 of the transfer apparatus may not come out of the protrusion 435 of the third plate 434.

For example, since the plurality of pins 470 do not protrude to the outside of the third plate 434, the electronic components 400 arranged on the substrate 501 may contact the protrusion 435 of the third plate 434 and may then adhere to the protrusion 435 so as to be raised.

Figure 5E:
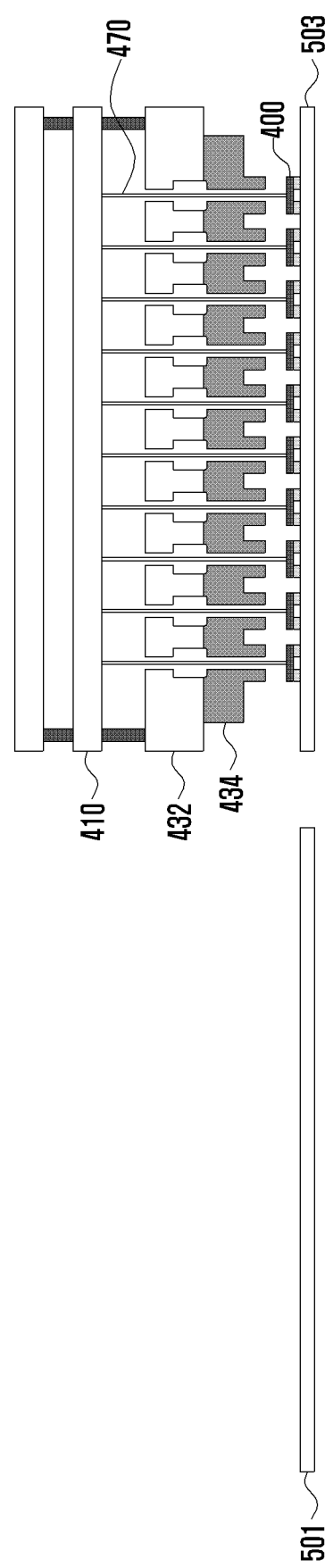

In FIG. 5E, a transfer apparatus of an electronic component according to various embodiments move to a position onto which the electronic components 400 are to be transferred, and the first plate 410 may be then operated to be closer to the second plate 432 by the descending operation of the first plate 410. Accordingly, the plurality of pins 470 may descend along with the first plate 410, and the plurality of pins 470 may be inserted through a plurality of hole regions of the second plate 432 and the third plate 434 to protrude to the outside.

For example, the plurality of pins 470 having protruded to the outside may push the electronic components 400 attached to the protrusion 435 of the third plate 434 and physically separate the electronic components 400 from the protrusion 435.

Therefore, the electronic components 400 may be separated from the protrusion 435 of the third plate 434 and be attached to the substrate 503 due to a difference of the adhesive force between the third plate 434 and the solder paste 505 of the substrate 503, and may be also properly transferred to desired positions on the substrate 503 without being out of specific positions on the substrate 503, by means of the physical pressure caused by the plurality of pins 470.

Figure 5F:
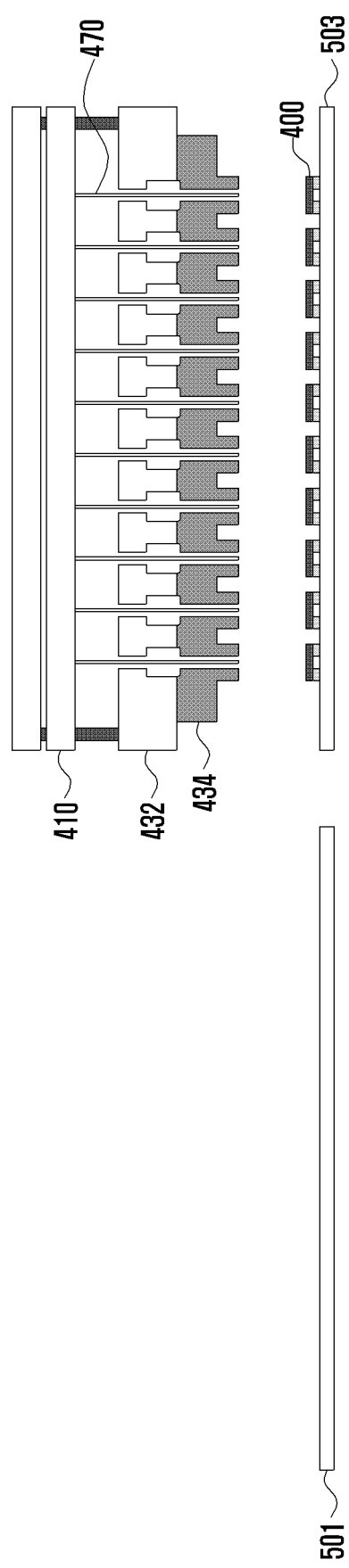

In FIG. 5F, when the transfer of the electronic components 400 is completed, the transfer apparatus may move above the substrate 503 and may then start a transfer operation of other electronic components 400. In this process, after the plurality of pins 470 push the electronic components 400 to separate the electronic components from the protrusion 435, the first plate 410 may be operated again to ascend, and the plurality of pins 470 may ascend along with the ascending operation of the first plate 410 to enter the inside of the third plate 434 so as not to protrude to the outside.

Figure 6:
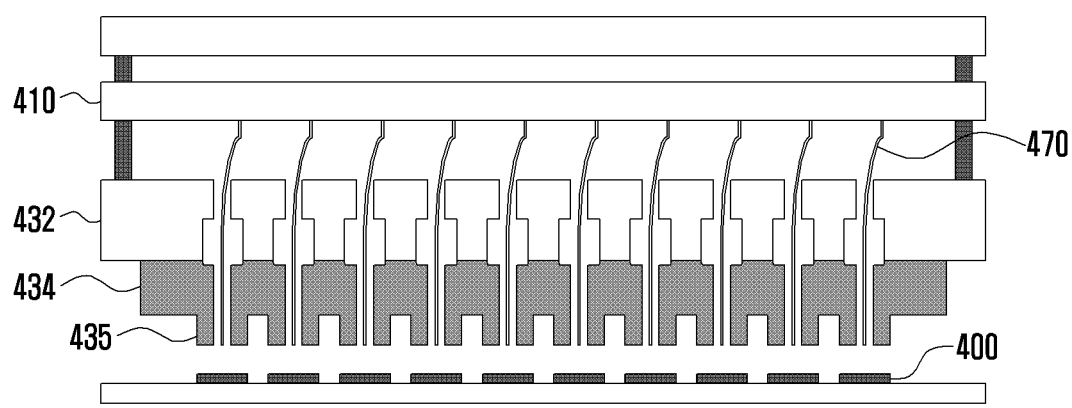
FIG. 6 is a diagram illustrating a form of a plurality of pins included in a transfer apparatus of an electronic component according to an embodiment of the disclosure.

FIG. 6 is a diagram illustrating a form of a plurality of pins 470 included in a transfer apparatus of an electronic component according to an embodiment of the disclosure.

Referring to FIG. 6, a plurality of pins 470 may be arranged in a structure in which at least some of the plurality of pins may be connected to a first plate 410 and may be inserted through a plurality of hole regions of a second plate 432 and a third plate 434.

According to an embodiment, at least some regions of the plurality of pins 470 may be formed to be curved in a space spaced between the first plate 410 and the second plate 432.

For example, as illustrated in FIG. 6, one region of each of the plurality of pins 470 may be formed to be curved, the one region being between the first plate 410 and the second plate 432, and when the plurality of pins 470 protrude to the outside so as to push the electronic components 400 attached to the protrusion 435 of the third plate 434 and then press the same against a solder paste 505, the plurality of pins 470 may have the elastic force due to the curved portions.

For example, as the plurality of pins 470 press the electronic components 400, the curved portions of the plurality of pins are at least partially compressed, and the elastic force of the plurality of compressed pins 470 enables the first plate 410 having descended to ascend.

The first plate 410 according to various embodiments may ascend and descend by the external driving force, and may descend by the external driving force and may ascend by using the elastic force.

Figure 7:
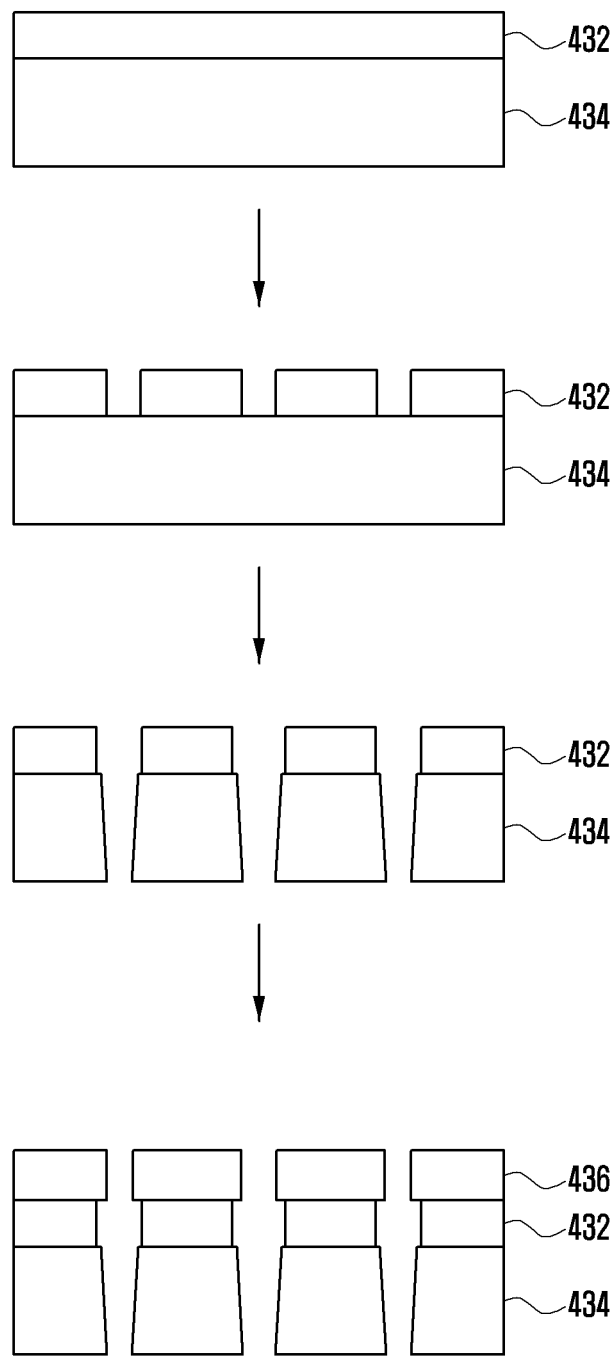
FIG. 7 is a diagram illustrating a method of forming a plurality of hole regions through a hole plate, according to various embodiments of the disclosure.

FIG. 7 is a diagram illustrating a method of forming a plurality of hole regions through a hole plate, according to various embodiments of the disclosure.

A hole plate of a transfer apparatus according to various embodiments may include hole regions through which a plurality of pins may be inserted.

According to various embodiments, the hole plate may be formed in a form in which a second plate 432 and a third plate 434, which are made of different materials, are bonded to each other. For example, the second plate 432 may be made of a material (for example, metal, ceramic, glass, or the like) having an excellent flatness characteristic, and the third plate 434 may be made of a material (for example, PDMS) having an excellent adhesion characteristic. For example, the second plate 432 may support the third plate 434 and enables pins penetrating through hole regions to be arranged perpendicular to the hole plate.

According to various embodiments, the hole plate may include a plurality of hole regions formed therethrough depending on a material characteristic of each plate.

For example, hole regions of the second plate 432 may be formed by means of the drilling work in a process before the second plate 432 and the third plate 434 are bonded to each other.

For example, hole regions of the third plate 434 may be formed by means of a laser beam radiated from a hole region direction of the second plate 432, after the third plate 434 is bonded to the second plate 432 including the hole regions formed by a drilling method. As illustrated in FIG. 7, when a hole region is formed by a laser irradiation method, a hole diameter of a laser irradiation direction may be formed to be larger than a hole diameter of the opposite direction.

For example, in case the hole plate is configured only by the third plate 434 having an excellent adhesion characteristic without the second plate 432, since hole regions should be formed according to the laser irradiation method, there may be a problem in that hole diameters on opposite sides of the plate are formed to be wide. For example, in a direction in which the hole plate contacts an electronic component, when the hole diameter is formed to be wide, an electronic component is formed to be smaller than the hole region of the hole plate and thus may not be raised. In addition, in a direction in which the hole plate faces a first plate, when the hole diameter is formed to be wide, there may be a problem in that, when a pin moves up and down, the pin is excessively shaken and is out of a position.

According to various embodiments of the disclosure, hole regions of the hole plate may be formed through the third plate 434 by the laser irradiation method after the third plate 434 is bonded to the second plate 432 including the hole regions formed by the drilling method, and the hole plate may be also formed by adding and bonding an additional plate 436 onto the other surface of the second plate 432, the additional plate including hole regions which are formed by the drilling method and have a diameter smaller than that of the hole regions of the second plate 432. For example, like the second plate 432, the additional plate 436 may be made of one of metal, ceramic, or glass.

According to various embodiments, a size of a protrusion and a size of a hole region of the third plate 434 included in a transfer apparatus may be determined depending on a size of an electronic component to be transferred and a size of a pin.

For example, since an electronic component should be attached to a protrusion of the third plate 434 to be moved, the protrusion of the third plate 434 may be formed to be larger than a size of the electronic component. In addition, a size of the hole region may be formed to be larger than a size of a pin penetrating through the hole region. For example, the size of the hole region may be formed to be 100 to 120% of the size of the pin.

The hole region of the third plate according to an embodiment may be formed to have a predetermined size corresponding the size of the pin. For example, a diameter of the hole region in a direction toward the protrusion of the third plate may be about 82 μm.

The diameter of the hole region in a direction opposite to the direction toward the protrusion of the third plate according to an embodiment may be about 146 μm.

In case the third plate is made of a material having an excellent adhesion characteristic, for example, is made of PDMS, a hole region is formed by a laser irradiation method, and the hole region of one side may be formed to be larger than the hole region of the other side.

According to various embodiments of the disclosure, even though the hole region of the one side of the third plate is formed to be larger, the excessive shaking of the pin may be prevented by means of a method of bonding the second plate to the third plate, the second plate including a hole region which is formed to be smaller than the hole region of the third plate.

The term "module" as used herein may, for example, mean a unit including one of hardware, software, and firmware or a combination of two or more of them. The "module" may be interchangeably used with, for example, the term "unit", "logic", "logical block", "component", or "circuit". The "module" may be the smallest unit of an integrated component or a part thereof. The "module" may be the smallest unit that performs one or more functions or a part thereof. The "module" may be mechanically or electronically implemented. For example, the "module" according to the disclosure may include at least one of an Application-Specific Integrated Circuit (ASIC) chip, a Field-Programmable Gate Arrays (FPGA), and a programmable-logic device for performing operations which has been known or are to be developed hereinafter.

According to various embodiments of the present disclosure, at least part of a device (e.g., modules or functions thereof) or a method (e.g., operations) according to the present disclosure be implemented, for example, by an instruction stored in a computer-readable storage media in a form of a programming module. When the instruction is executed by at least one processor, the at least one processor may perform a function corresponding to the instruction. The computer readable storage media may be, for example, the memory.

The computer-readable storage media may include Magnetic Media such as hard disk, floppy disk, or magnetic tape, Optical Media such as Compact Disc Read Only Memory (CD-ROM) or Digital Versatile Disc (DVD), Magneto-Optical Media such as floptical disk, and a hardware device such as Read Only Memory (ROM), Random Access Memory (RAM), or flash memory for storing and executing program commands (e.g., a programming module). Further, the program command may include a machine language code created by a compiler and a high-level language code executable by a computer using an interpreter. The foregoing hardware device may be configured to be operated according to at least one software module to perform an operation of the present disclosure, or software modules may be configured to be operated according to the hardware device.

According to various embodiments of the module and the program module may include at least one of above elements or may omit some elements or include other elements.

According to various embodiments, operations performed by the module, the program, or another component may be carried out sequentially, in parallel, repeatedly, or heuristically, or one or more of the operations may be executed in a different order or omitted, or one or more other operations may be added.

The embodiments disclosed in this document have been presented to easily explain technical contents of the disclosure and help comprehension of the disclosure, and do not limit the scope of the disclosure. Therefore, the scope of the disclosure should be interpreted to include various other embodiments or all modifications based on the technical idea of the disclosure.

What is claimed is:

1. A micro-chip gripper comprising:
a pin plate having a first surface;
a hole plate having a first surface facing a second surface of the pin plate and being spaced apart therefrom, the hole plate being movable together with the pin plate and including a plurality of holes formed therethrough;
pins supported at first end portions thereof by the pin plate, each pin inserted into and being movable within a corresponding one of the plurality of holes of the hole plate; and
an adhesive layer covering a second surface of the hole plate,
wherein the second surface of the hole plate includes a plurality of protrusions formed to correspond to an arrangement of micro-chips to be transferred by the micro-chip gripper, and
wherein the plurality of protrusions is configured to press the adhesive layer to the micro-chips when the pins are pushed into the hole plate.

2. The micro-chip gripper of claim 1, wherein the plurality of holes of the hole plate are formed to correspond to the arrangement of micro-chips to be transferred by the micro-chip gripper.

3. The micro-chip gripper of claim 1, wherein the plurality of holes of the hole plate is formed to correspond to positions of the protrusions, and
wherein each protrusion includes one or more of the plurality of holes.

4. The micro-chip gripper of claim 1, wherein a pin length of the pins is longer than a distance from the second surface of the pin plate to the second surface of the hole plate, and
wherein each pin is longitudinally curved at a position corresponding to the space between the pin plate and the hole plate.

5. A micro-chip transfer apparatus comprising the micro-gripper of claim 1.

6. The micro-chip transfer apparatus of claim 5, wherein the plurality of holes of the hole plate are formed to correspond to an arrangement of microchips to be transferred by the micro-gripper.

7. The micro-chip transfer apparatus of claim 6, wherein the plurality of holes of the hole plate is formed to correspond to positions of the protrusions, and
wherein each protrusion includes one or more holes of the plurality of holes.

8. The micro-chip transfer apparatus of claim 5, wherein a pin length of the pins is longer than a distance from the second surface of the pin plate to the second surface of the hole plate, and
wherein each pin is longitudinally curved at a position corresponding to the space between the pin plate and the hole plate.

9. A transfer apparatus of electronic components comprising:
- a plurality of pins;
- a first plate connected to the plurality of pins to support the plurality of pins;
- a second plate including a first surface opposite to a first surface of the first plate, and a second surface oriented in a direction opposite to the first surface thereof, and the second plate including a plurality of holes through which the plurality of pins are inserted and within which the pins are movable; and
- a third plate having a first surface attached to the second surface of the second plate and including a plurality of holes through which the plurality of pins is inserted and within which the pins are movable,
- wherein the third plate includes a polydimethylsiloxane (PDMS) layer,
- wherein the third plate includes a plurality of protrusions formed to correspond to an arrangement of electronic components to be transferred, and
- wherein the plurality of protrusions is configured to press the electronic components when the pins are pushed into the holes of the second plate and the third plate.

10. The transfer apparatus of claim 9, wherein the respective pins move in accordance with movement of the first plate.

11. The transfer apparatus of claim 9, wherein the second plate comprises at least one of metal, ceramic, or glass.

12. The transfer apparatus of claim 9, wherein the plurality of holes of the third plate are formed laser beam irradiation.

13. The transfer apparatus of claim 9, further comprising an additional plate including holes provided in correspondence with holes of the second plate,
- wherein a diameter of each of the plurality of holes of the second plate is larger than a diameter of each of the plurality of holes of the additional plate.

* * * * *